United States Patent [19]
Waggoner

[11] Patent Number: 5,969,541
[45] Date of Patent: Oct. 19, 1999

[54] CURRENT INHIBITING I/O BUFFER HAVING A 5 VOLT TOLERANT INPUT AND METHOD OF INHIBITING CURRENT

[75] Inventor: Charles D. Waggoner, Richardson, Tex.

[73] Assignee: STMicroelectronics, Inc., Carrollton, Tex.

[21] Appl. No.: 08/858,867

[22] Filed: May 19, 1997

[51] Int. Cl.[6] .............................................. H03K 19/0185
[52] U.S. Cl. ................................ 326/81; 326/58; 326/68; 326/86
[58] Field of Search ................................. 326/57, 58, 83, 326/86, 68, 70, 71, 80, 81

[56] References Cited

U.S. PATENT DOCUMENTS

| | | | |
|---|---|---|---|
| 5,019,724 | 5/1991 | McClure | 307/443 |
| 5,021,684 | 6/1991 | Ahuja et al. | 307/443 |
| 5,218,243 | 6/1993 | Keown et al. | 307/446 |
| 5,300,832 | 4/1994 | Rogers | 307/475 |
| 5,381,061 | 1/1995 | Davis | 326/57 |
| 5,396,128 | 3/1995 | Dunning et al. | 326/68 |
| 5,450,025 | 9/1995 | Shay | 326/81 |
| 5,467,031 | 11/1995 | Nguyet et al. | 326/81 |
| 5,541,527 | 7/1996 | Ma | 326/21 |
| 5,543,733 | 8/1996 | Mattos et al. | 326/81 |
| 5,546,019 | 8/1996 | Liao | 326/81 |
| 5,568,062 | 10/1996 | Kaplinsky | 326/27 |
| 5,570,042 | 10/1996 | Ma | 326/63 |
| 5,570,043 | 10/1996 | Churchhill | 326/81 |
| 5,574,389 | 11/1996 | Chu | 326/81 |
| 5,592,104 | 1/1997 | Bach | 326/27 |
| 5,598,122 | 1/1997 | McClure | 327/538 |
| 5,646,550 | 7/1997 | Campbell, Jr. et al. | 326/81 |
| 5,682,110 | 10/1997 | Rountree | 326/58 |
| 5,729,157 | 3/1998 | Monk et al. | 326/80 |
| 5,748,011 | 5/1998 | Takahashi et al. | 326/81 |
| 5,825,206 | 10/1998 | Krishnamurthy et al. | 326/81 |

*Primary Examiner*—Jon Santamauro
*Assistant Examiner*—Don Phu Le
*Attorney, Agent, or Firm*—Theodore E. Galanthay; Lisa K. Jorgenson; Christopher F. Regan

[57] ABSTRACT

A tri-state I/O buffer and a method of inhibiting current to an I/O buffer arranged to be powered by a supply voltage and to drive an output terminal are provided. The I/O buffer preferably has an output driving circuit connected to the supply voltage for driving the output terminal and includes a first plurality of transistors defining an isolated floating well circuit for operatively connecting the output terminal to the supply voltage and a second plurality of transistors defining a pull-down circuit for operatively connecting the output terminal to ground. An input control circuit is connected to the output driving circuit and the supply voltage, and is arranged to receive a buffer input signal for controlling the buffer input signal to the output driving circuit. A bias controlling circuit is connected to the isolated floating well circuit and the supply voltage, and is arranged to receive a tri-state enabling signal and the buffer input signal for controlling a biasing signal to the floating well circuit.

45 Claims, 5 Drawing Sheets

5,969,541

CURRENT INHIBITING I/O BUFFER HAVING A 5 VOLT TOLERANT INPUT AND METHOD OF INHIBITING CURRENT

FIELD OF THE INVENTION

The present invention relates to electronic systems and, more particularly, to the field of electronic interfaces for these systems.

BACKGROUND OF THE INVENTION

Over the years, advancements have been made in microelectronic integrated circuit fabrication technology which has enabled the sizes of circuit devices to be progressively reduced in order that more and more devices can be positioned on a single integrated circuit chip. Despite these advancements, some devices are easier to reduce to smaller sizes than others. For example, although logic devices went to a lower voltage before memory device, memory devices generally are now being reduced to a smaller size at a substantially faster rate than many logic devices which often interface with or connect to the memory devices.

Many types of logic devices, such as Transistor—Transistor Logic ("TTL") devices, are conventionally powered by a five (5) volt supply or power supply. Nevertheless, problems can be encountered when memory devices which interface with the logic devices are attempted to be powered with a 5 volt power supply. For example, because memory devices often have smaller feature sizes, a 5 volt signal applied to such a device can destroy the device, e.g. causing the gate oxide to break down.

For this and other reasons, logic devices, memory, and other integrated circuit devices have slowly migrated from conventional 5 volt designs to lower voltage designs such as 3.3 volts. Interfacing various components and systems with different voltage tolerances has become an important design issue that has needed to be and continues to need to be addressed. For example, low voltage memory devices still need to interface with or be connected to logic devices, such as TTL devices, and other devices that still operate at 5 volts. These devices often need to be connected to a common input/output ("I/O") line.

Memory devices which operate on 3.3 volts are often capable of driving 5 volt logic devices. Such a memory device is provided with a tri-state output driver or driving circuit that selectively operates in a normal drive mode, and also in a tri-state or high impedance mode in which the driver is somewhat transparent to the output line to which it is connected. If protection is not designed into the circuit, a 5 volt logic signal applied to the input line to which a 3.3 volt tri-state driver is connected can destroy the driver, e.g., due to the break down of the gate oxide.

Attempts have been made to design I/O buffers or buffering circuits which tolerate a 5 volt input. Examples of such attempts can be seen in U.S. Pat. No. 5,546,019 by Liao titled "CMOS I/O Circuit With 3.3 Volt Output And Tolerance Of 5 Volt Input," U.S. Pat. No. 5,450,025 by Shay titled "Tristate Driver For Interfacing To A Bus Subject To Overvoltage Conditions," and U.S. Pat. No. 5,467,031 by Nguyen et al. titled "3.3 Volt CMOS Tri-State Driver Circuit Capable Of Driving Common 5 Volt Line." These attempts however, can be complex, expensive, and less effective in protecting an output driver from destruction. Additionally, these prior attempt can be less effective in inhibiting or preventing unwanted current draw or flow, e.g., leakage current, from the output terminal during tri-state conditions and can load other output drivers in a network during tri-state conditions.

SUMMARY OF THE INVENTION

With the foregoing in mind, the present invention advantageously provides a current inhibiting I/O buffer that can be used with 5 volts and inhibits unwanted current draw (e.g., no leakage current) from an output terminal thereof when entering tri-state conditions. The present invention also advantageously provides a cost effective solution for problems associated with interfacing with higher voltage external circuits by providing a current inhibiting I/O buffer that has an output driving circuit which includes a plurality of transistors defining an isolated floating well circuit for operatively connecting the output terminal to a supply voltage. The present invention further advantageously provides an I/O tri-state buffer having a TTL integrated circuit configuration, an output driving circuit which includes a floating well circuit, and which isolates the output driving circuit when the floating well of the output driving circuit is positively biased by an external voltage applied to the output terminal. The present invention still further advantageously provides an I/O tri-state buffer that does not load other output driving circuits in a network during tri-state conditions.

More particularly, a tri-state I/O buffer according to the present invention is preferably arranged to be powered by a supply voltage and to drive an output terminal. The I/O buffer preferably has output driving means connected to the supply voltage and the output terminal for driving the output terminal. The output driving means includes a plurality of transistors defining an isolated floating well circuit for operatively connecting the output terminal to the supply voltage. Input controlling means is connected to the output driving means, cooperates with the supply voltage, and is arranged to receive a buffer input signal for controlling the buffer input signal to the output driving means. The I/O buffer also has bias controlling means connected to the isolated floating well circuit of the output driving means for controlling a biasing signal to the isolated floating well circuit.

According to another aspect of the present invention, an I/O buffer preferably also includes input isolating means responsive to the input controlling means and arranged to receive the tri-state enabling signal for operatively isolating a buffer input control signal to the isolated floating well circuit. The input isolating means is preferably provided by at least a pair of transistors. One of the pair of transistors is operatively connected to the gate of one of the plurality of transistors, e.g., an output transistor, of the isolated floating well circuit and another of the pair of transistors is operatively connected to the gate of another one of the plurality of transistors, e.g., a well control transistor.

According to yet another aspect of the present invention, the bias controlling means of the I/O buffer preferably includes voltage swing limiting means connected to the isolated floating well circuit of the output driving means for limiting the voltage swing of at least one of the transistors to thereby inhibit overstressing of the gate oxide. The bias controlling means advantageously can also include a first plurality of transistors defining an inverting circuit and a second plurality of transistors and defining a NOR gate circuit. The voltage swing limiting means advantageously is connected to a source of at least one of the transistors of each of the inverting circuit and the NOR gate circuit.

For example, I/O buffer according to the present invention has at least one output transistor of the isolated floating well circuit which is advantageously turned off by operatively tying the gate of the at least one output transistor to the floating well. This design of the isolated floating well circuit takes advantage of the floating well to ensure that the output transistor is solidly turned off and to inhibit or prevent damage from spikes or other spurious signals in the circuit.

The present invention also advantageously provides a method of inhibiting current flow during a high impedance condition in a tri-state I/O buffer arranged to be powered by a supply voltage and to drive an output terminal. The output terminal is preferably arranged to receive an external voltage which can be higher than the supply voltage during the high impedance. The method preferably includes operatively connecting the output terminal to the supply voltage with an isolated floating well circuit so as to drive the output terminal and controlling a buffer input signal supplied to the isolated floating well circuit. A biasing control signal is preferably initiated to the isolated floating well circuit, and the voltage swing of at least one of the plurality of transistors of the floating well circuit is limited. Accordingly, overstressing of the gate oxide of the plurality of transistors is significantly inhibited when at least one of the plurality of transistors is forwardly biased and the floating well is positively biased by the external voltage applied to the output terminal.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF PREFERRED EMBODIMENTS

The present invention will now be described more fully hereinafter with reference to the accompanying drawings which illustrate preferred embodiments of the invention. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art.

Figure 1:
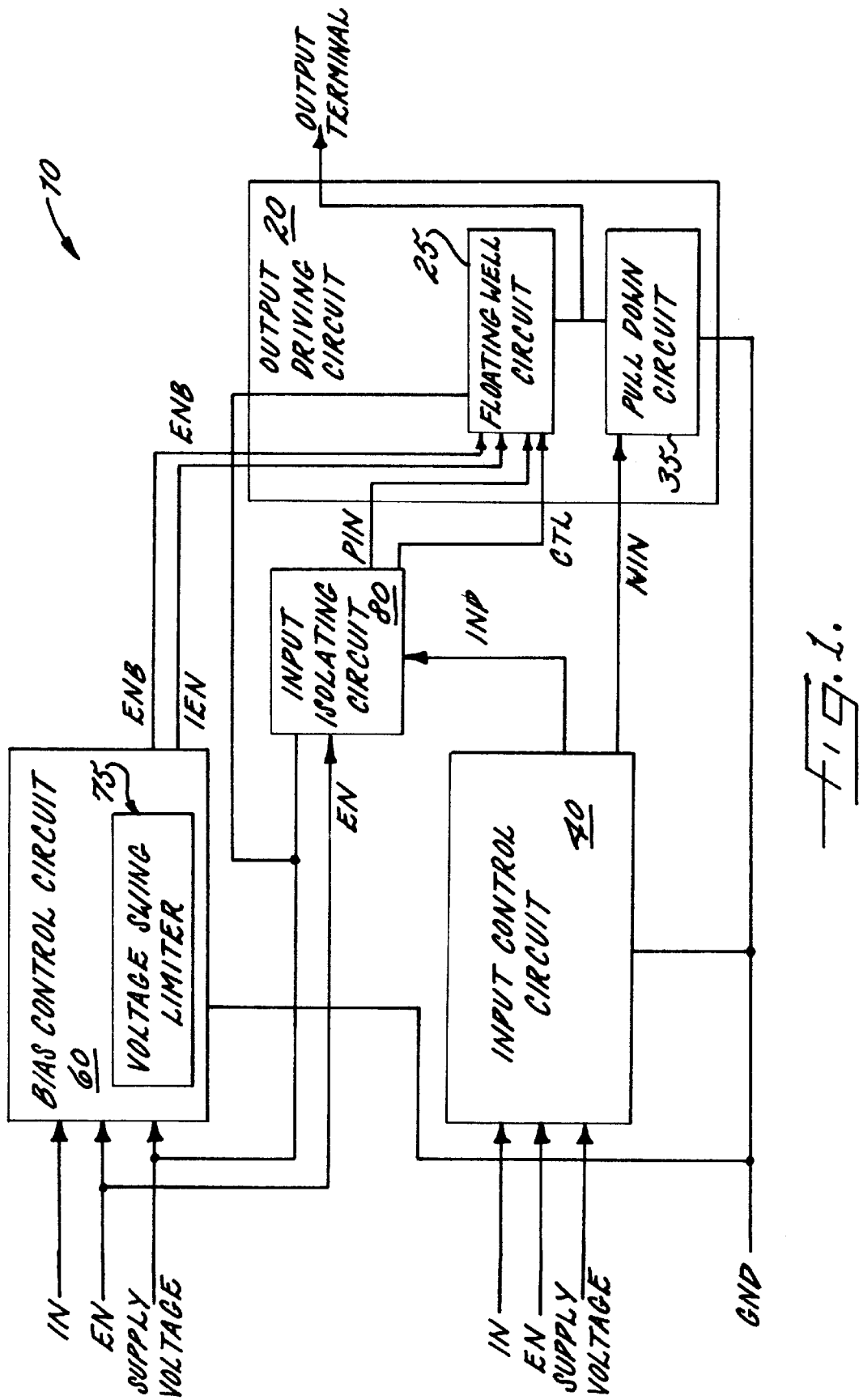
FIG. 1 is a schematic block diagram of a current inhibiting I/O buffer according to an embodiment of the present invention.
Figure 2:
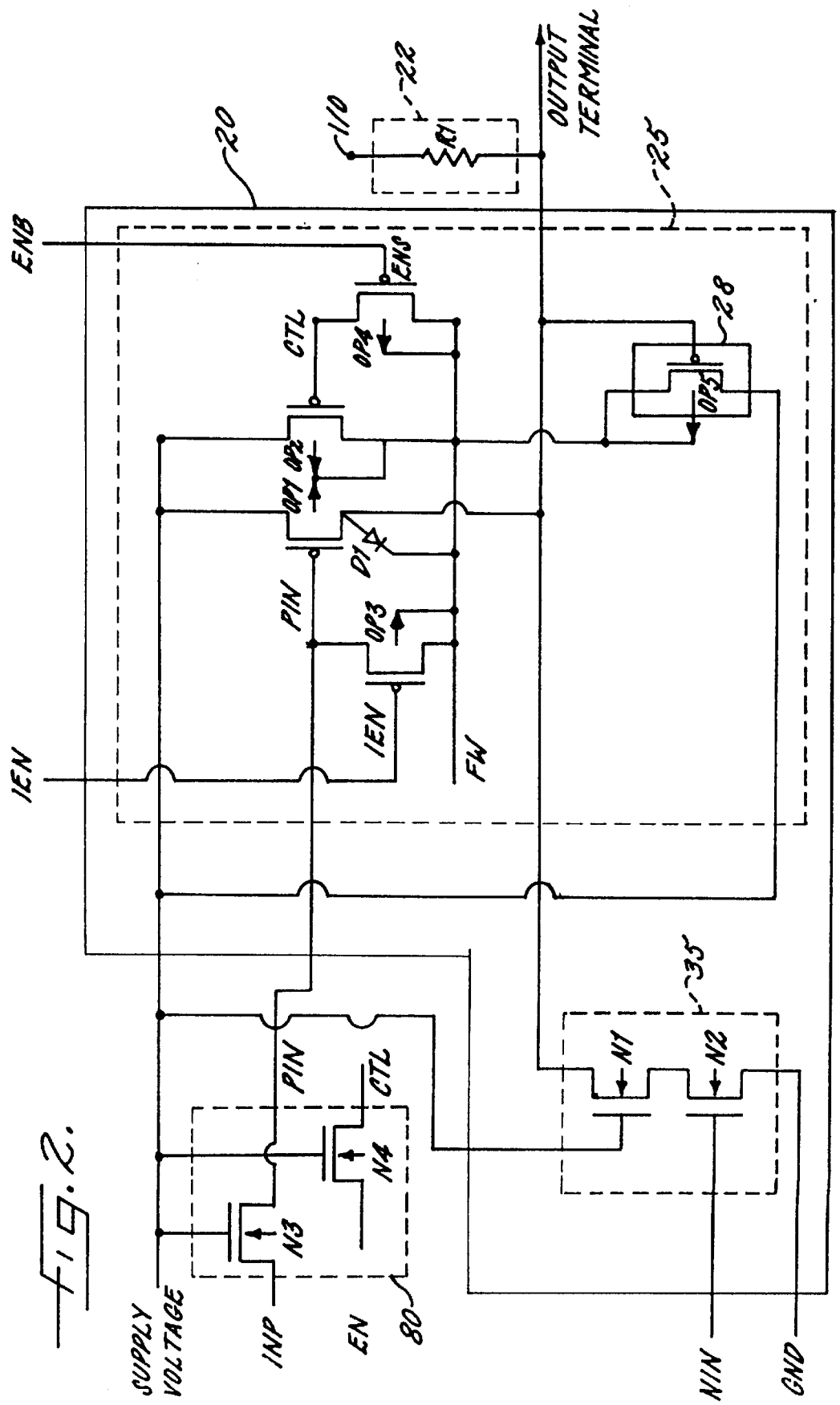
FIG. 2 is a schematic circuit diagram of an output driving circuit of a current inhibiting I/O buffer according to an embodiment of the present invention.

Initially, FIGS. 1–2 illustrate a current inhibiting tri-state input-output ("I/O") buffer 10 having a five (5) volt tolerant input (e.g., capable of use with 5 volt circuits) which is preferably formed as a TTL (i.e., using PMOS and NMOS transistors in a CMOS configuration) integrated circuit. Unlike conventional I/O buffers, the I/O buffer 10 of the present invention advantageously does not draw current, e.g., non-leaky or no leakage current, when an external voltage signal is applied to an output driving transistor OP1 when no supply voltage (+$V_{DD}$) is applied to the buffer 10 and does not load other drivers on a network during tri-state conditions.

The I/O buffer 10 is preferably arranged to be powered by a supply voltage and to drive an output terminal. The output terminal preferably is arranged to receive an external voltage which can be higher than the supply voltage during high impedance or tri-state conditions. The I/O buffer 10 has output driving means 20, e.g., preferably provided by an output driving circuit, connected to the supply voltage for driving the output terminal. The output driving means 20 preferably includes a first plurality of transistors OP1, OP2, OP3, OP4 having a first conductivity type, e.g., PMOS, defining an isolated floating well circuit 25 for operatively connecting the output terminal to the supply voltage and a second plurality of transistors N1, N2 having a second conductivity type, e.g., NMOS, defining a pull-down circuit 35 for operatively connecting the output terminal to ground.

As best illustrated in FIG. 2, the isolated floating well circuit 25, i.e., the first plurality of transistors, of the output driving circuit 20 preferably has at least four PMOS transistors OP1, OP2, OP3, OP4 formed in a common N-well using conventional technology. The first plurality of transistors preferably defines the isolated floating well circuit 25 which includes pull-up capabilities and which is preferably biased through OP2 during normal operation. The transistor OP1 is preferably the output transistor which is connected to the output terminal as illustrated. As understood by those skilled in the art, the output transistor OP1 can also be formed by a plurality of transistors in parallel. The output transistor OP1 operatively connects the output terminal to the supply voltage. The transistor OP2 is the well control transistor. The well control transistor OP2 is connected to a floating well for controlling the common N well of the plurality of PMOS transistors OP1, OP2, OP3, OP4. The well control transistor OP2 also preferably is designed to withstand electrostatic discharge ("ESD") or other spurious signals within the I/O buffer 10.

The transistor OP3 is one of the control transistors for the gate of the output transistor OP1. When the transistor OP3 is turned on, the transistor OP3 pulls signal PIN to the voltage on the floating well ("FW"). The purpose of the transistor OP3 is to turn off the output transistor OP1, e.g., by the tying of the gate of the output transistor OP1 to the FW. The transistor OP4 is the other control transistor for the gate of the well control transistor OP2. When the transistor OP4 is turned on, the transistor OP4 pulls the signal CTL to the FW voltage. The transistor OP4 is driven by a tri-state enabling signal ("ENB").

Advantageously, at least one OP1 of the output transistors OP1, OP2, and preferably both output transistors OP1, OP2, is turned off by operatively tying the gate of the at least one of the output transistors to the FW, e.g., a non-conducting state. This design of the floating well circuit 25, for example, takes advantage of the FW to ensure that the transistors OP1, OP2 are solidly turned off and to inhibit or prevent damage from spikes or other spurious signals, e.g., the FW can perform as a cup and a filter. Notably, although the transistors OP3 and OP4 are solidly turned off, these transistors OP3, OP4 are never completely turned on. As understood by those skilled in the art, this status of these transistors OP3, OP4, however, is still enough to provide the needed resistive input for the circuit 25, e.g., operatively, driving a small load during a static condition.

In operation, during tri-state or fail safe operation, the FW is preferably biased through a P+ to N-well diode formed by the drain section of OP1 and the FW. This is schematically shown by the diode D1 on the circuit schematic of FIG. 2. A voltage converter circuit 22, e.g., a resistor R1, additionally can be connected to the output terminal to convert a current signal to a voltage signal or vice-versa to provide an input/output interfacing signal with the buffer 10.

Also, a supplemental well controller 28 which provides additional well control advantageously can be provided by a fifth PMOS transistor OP5 connected to the output terminal and the FW as illustrated. The optional additional well control transistor OP5 is not necessary for the successful operation of the buffer 10. Its purpose is to bias the well to $V_{DD}$ during tri-state operation when the output terminal signal is pulled down or pulled low. This holds the well voltage closer to $V_{DD}$ than the $V_{BE}$ of the diode D1 during part of the time the output driving circuit 20 is in a tri-state condition. For example, it will allow the designer to not pay as much attention to latch up prevention during the layout of the silicon for this circuit 20.

The second plurality of transistors which defines the pull-down circuit 35 preferably includes a plurality of NMOS transistors N1, N2. The transistors N1, N2 are the NMOS output transistors positioned in a stacked configuration that work in connection with OP2 to pull the output terminal positive or negative. The transistor N2 is preferably a pull-down output switching transistor, and the transistor N1 is connected to the one pull-down output switching transistor N2. The stacked transistor N2 preferably forms an output terminal isolation device arranged to receive an external voltage from the output terminal and responsively reduce the voltage received by the output switching transistor N1. The stacked configuration is used because, as described above, this technology preferably does not allow a source/drain-to-gate voltage to be greater than 3.6 volts in normal operation and has a maximum of 4.0 volts.

When the transistor N2 is off and the output terminal is pulled to 5.5 volts, the minimum $V_{DD}$ applied to the base of N1 is 2.7 volts which is within a desired predetermined range which inhibits damage to the transistors. The transistor N1 operates as a diode and, thus, protects the switching transistor N2 while the output switching transistor N2 controls the switching of the output terminal in conjunction with the output transistor OP1.

Figure 3:
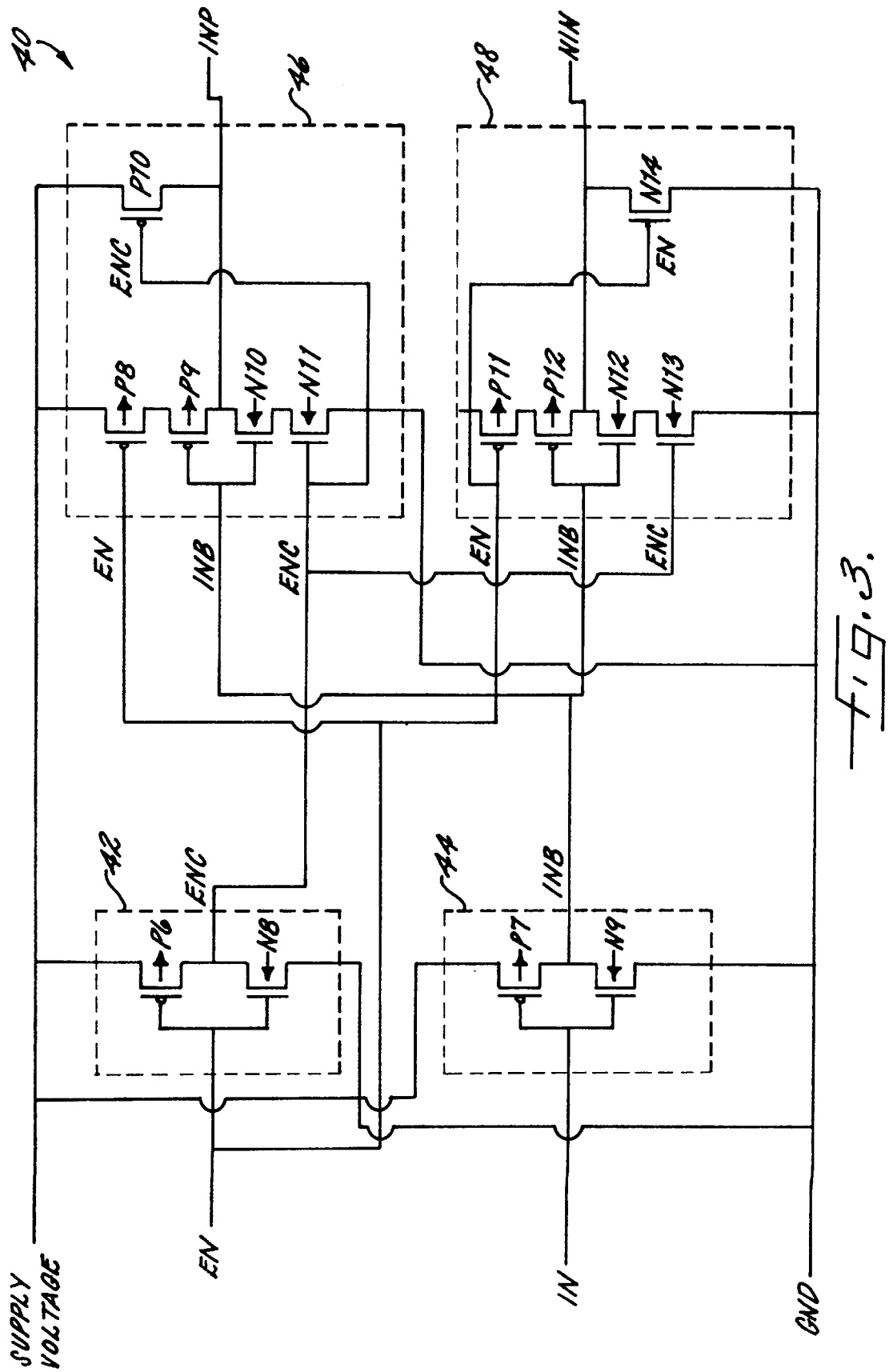
FIG. 3 is a schematic circuit diagram of an input controlling circuit of a current inhibiting I/O buffer according to an embodiment of the present invention.

Additionally, as illustrated in FIG. 3, the I/O buffer 10 also includes input controlling means 40 connected to the isolated floating well circuit 25 and the pull-down circuit 35 of the output driving means 20. The input controlling means receives a buffer input signal for controlling the buffer input signal respectively to each of the isolated floating well and pull-down circuits 25, 35. The input controlling means 40, e.g., preferably provided by a stacked control circuit, preferably also includes a plurality of transistors, namely PMOS transistors P6, P7, P8, P9, P10, P11, and P12 and NMOS transistors N8, N9, N10, N11, N12, N13, and N14. The output of this input control circuit 40 is signals INP and NIN. INP operates in conjunction with IEN to control PIN while NIN controls the switching transistor N2.

More particularly, the input controlling means 40 preferably includes signal inverting means arranged to receive the buffer input signal IN and the tri-state enabling signal EN for inverting each of the buffer input and tri-state enabling signals IN, EN. The signal inverting means is preferably provided by a pair of inverting circuits 42, 44 formed by respective pairs of PMOS and NMOS transistors P6, N8, P7, N9. One of the pair of inverting circuits 42, 44 inverts the tri-state enabling signal EN to provide an inverted tri-state enabling signal ENC. The other of the pair of inverting circuits 42, 44 inverts the buffer input signal IN to provide an inverted buffer input signal INB.

The input controlling means 40 further includes a floating well input controlling circuit 46 and a pull-down input controlling circuit 48 each respectively connected to the signal inverting means 42, 44. The floating well input controlling circuit 46 preferably includes a plurality of PMOS and NMOS transistors P8, P9, P10, N10, N11 as illustrated. The pull-down input controlling circuit 48 likewise includes a plurality of PMOS and NMOS transistors P11, P12, N12, N13, N14 as illustrated. Each of the isolated floating well and pull-down input controlling circuits 25, 45 are arranged to receive the tri-state enabling signal EN, the inverted tri-state enabling signal ENC, and the inverted buffer input signal INB and responsively provide a floating well input control signal INP and a pull-down input control signal NIN respectively to the isolated floating well circuit 25, i.e., through the input isolating means 80 described further herein, and the pull-down circuit 35.

Figure 4:
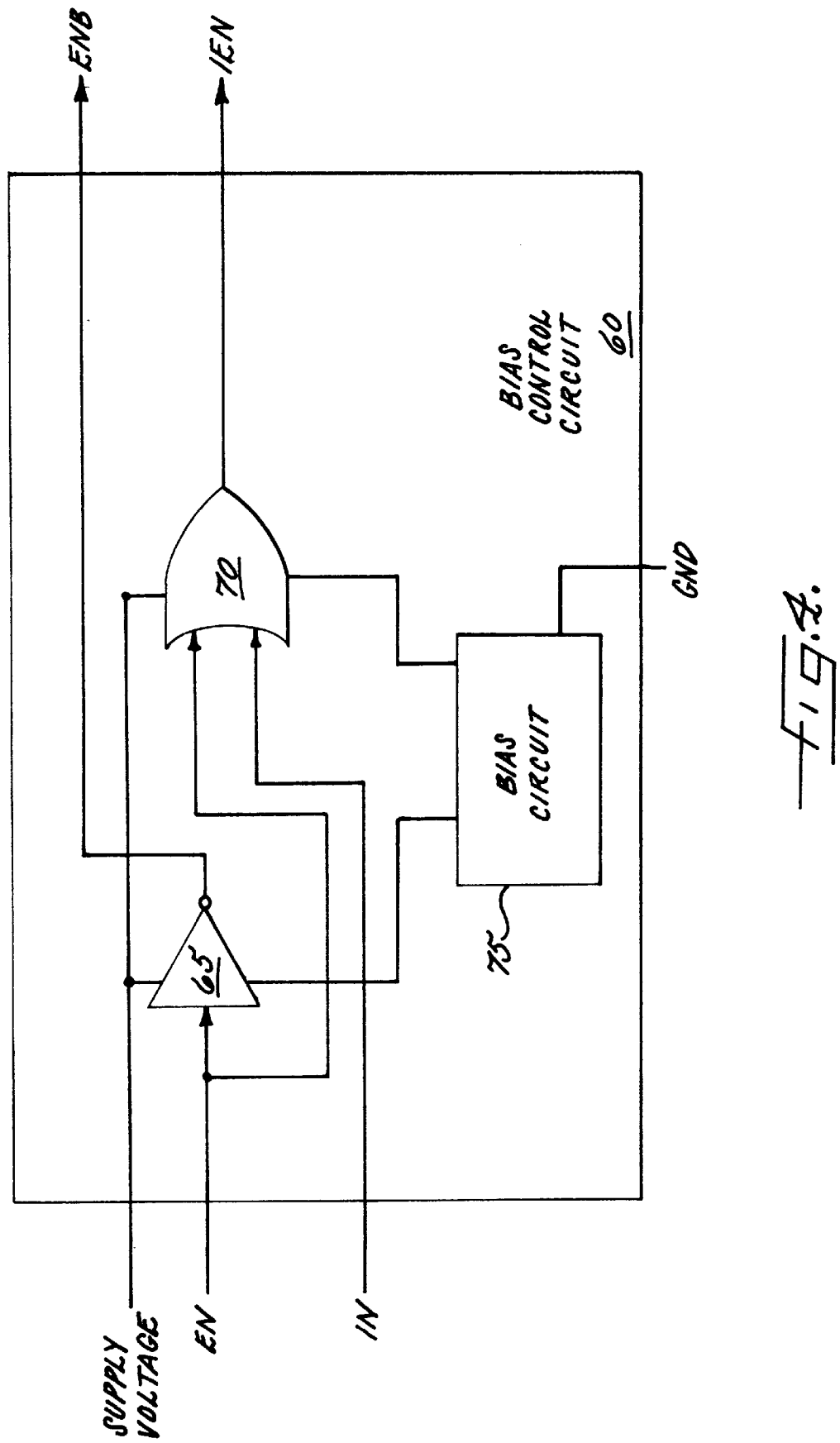
FIG. 4 is a schematic block diagram of a biasing control circuit of a current inhibiting I/O buffer according to an embodiment of the present invention.
Figure 5:
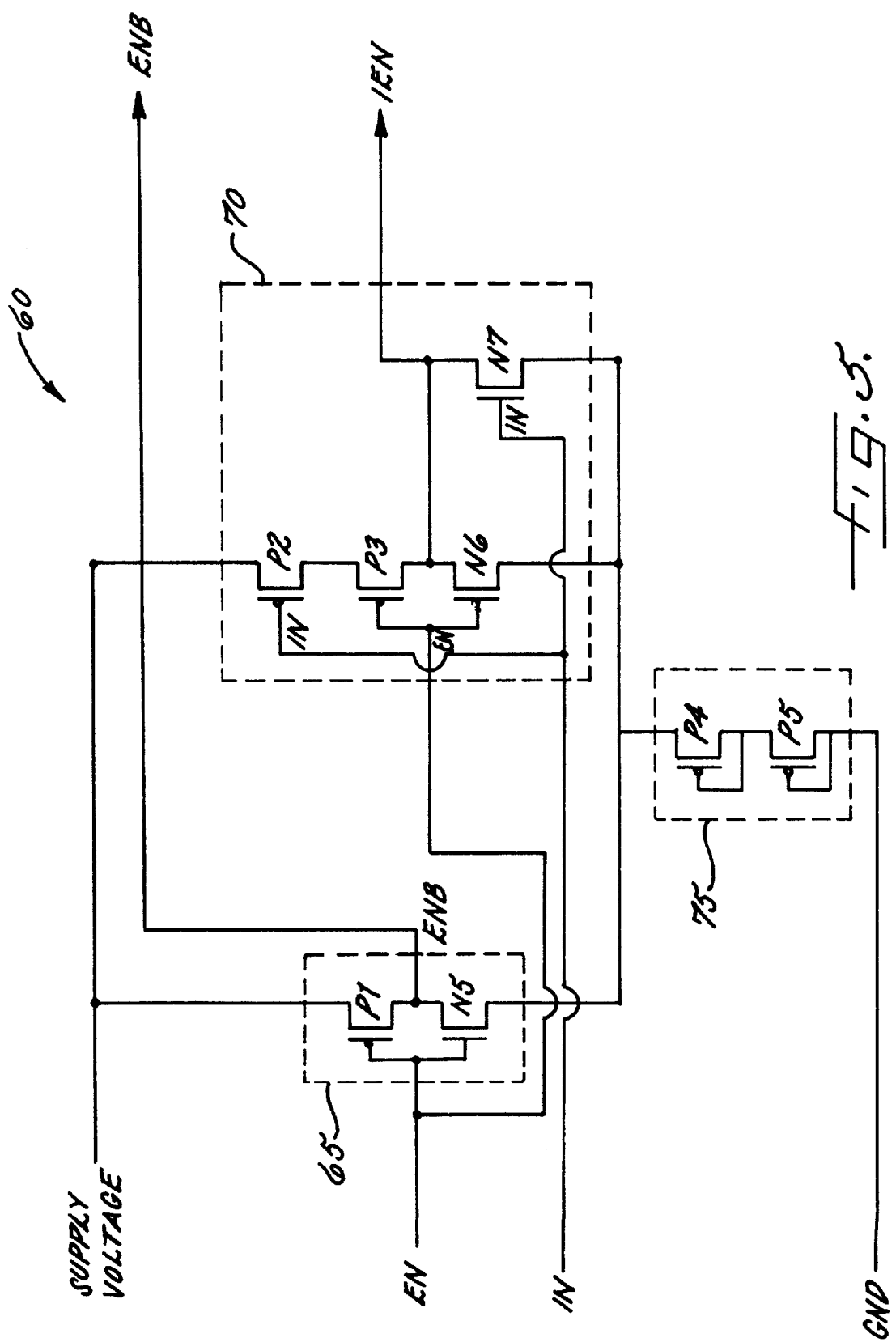
FIG. 5 is a schematic circuit diagram of a biasing control circuit of a current inhibiting I/O buffer according to an embodiment of the present invention.

Also, as best illustrated in FIGS. 4–5, the I/O buffer 10 of the present invention preferably includes bias controlling means 60 connected to the isolated floating well circuit 25 of the output driving means 20, connected to the supply voltage $V_{DD}$, and arranged to receive a tri-state enabling signal EN and the buffer input signal IN for providing a biasing control signal IEN to the isolated floating well circuit 25. The bias controlling means 60, e.g., preferably provided by a biasing control circuit, includes a plurality of transistors, namely PMOS transistors P1, P2, P3, P4, and P5 and NMOS transistors N5, N6, and N7.

The bias controlling means 60 preferably includes voltage swing limiting means 75 connected to the isolated floating well circuit 25 of the output driving means 20 for limiting the voltage swing of at least one of the plurality of PMOS transistors OP1, OP2, OP3, OP4, OP5 to thereby inhibit or prevent overstressing of the gate oxide thereof (see FIGS. 1 and 4–5). The voltage swing limiting means 75 is preferably provided by a biasing circuit arranged to be connected to ground as illustrated. The biasing circuit 75 preferably is formed by a pair of PMOS transistors P4, P5 arranged in a stacked configuration. The voltage swing limiting means 75 is preferably configured to limit the voltage swing of the third and fourth OP3, OP4 of the plurality of PMOS transistors OP1, OP2, OP3, OP4, OP5 of the isolated floating well circuit 25 to thereby inhibit or prevent overstressing of the gate oxide of these transistors OP3, OP4 when these third and fourth transistors OP3, OP4 are forwardly biased and the floating well is positively biased by an external voltage applied to the output terminal.

The bias controlling means 60 further includes a first plurality of transistors P1, N5 defining an inverting circuit 65, e.g., a CMOS configuration, and a second plurality of transistors P2, P3, N6, N7 defining a NOR gate circuit 70, e.g., a CMOS configuration. The inverting circuit 65 preferably is provided by an NMOS transistor N5 and a stacked PMOS transistor P1 each having the gate thereof arranged to receive the tri-state enabling signal EN. The drain of the stacked PMOS transistor cooperates with the supply voltage $V_{DD}$. The source of the stacked PMOS transistor P1 and the source of the NMOS transistor N5 are connected to the isolated floating well circuit 25 of the output driving means 20 as illustrated so as to provide a tri-state enabling output signal ENB thereto responsive to the tri-state input enabling signal EN. The source of the NMOS transistor N5 of the inverting circuit 65 is connected to the voltage swing limiting means 75, e.g., provided by the biasing circuit as illustrated.

The bias controlling means 60 further has a second plurality of PMOS and NMOS transistors P2, P3, N6, N7. The second plurality of transistors is connected to the biasing circuit 75 and the isolated floating well circuit 25 of the output driving means 20, is arranged to receive the buffering input signal IN and the tri-state enabling signal EN, and defines the NOR gate circuit 70. The voltage swing limiting means 75 also is preferably connected to a source of at least one of the plurality of transistors P2, P3, N6, N7, e.g., preferably the NMOS transistors N6, N7, of the NOR gate circuit 70.

By including the voltage swing limiting means 75, the output signals, ENB and IEN, of this biasing control circuit 60 advantageously do not swing from $V_{DD}$ to ground ("GND"). Instead, the output signals swing from $V_{DD}$ to between 1.0–2.0 volts. The purpose of the limited voltage swing is to prevent overstressing the gate oxide of OP3 and OP4 when they are on (applied voltage of 1–2 volts) and the FW is pulled positive by a signal applied to the output terminal. Due to the nature of the biasing circuit 75 formed by the transistors P4 and P5 when the FW is at elevated voltages, the bias is about 2.0 volts. The output signals of this section are an inverted tri-state enabling signal ENB which controls the transistor OP4 and an output signal IEN from the NOR gate circuit 70 which controls the transistor OP3. The transistor OP4 is on during tri-state conditions and off when the output driving circuit 20 is in operation. The transistor OP3 is used to control the gate of the output transistor OP1, i.e., at PIN, during normal operation and tri-state conditions.

The I/O buffer 10 further includes input isolating means 80, e.g., preferably provided by an input isolating circuit, which is responsive to the input controlling means 40, connected to the isolated floating well circuit 25 of the output driving means 20, connected to the supply voltage, and arranged to receive the tri-state enabling signal. The input isolating means 80 operatively isolates a buffer input control signal to the isolated floating well circuit 25 of the output driving circuit 20 (see FIGS. 1–2). The input isolating means 80 is preferably provided by a pair of NMOS transistors N3, N4. One of the pair of transistors N3, N4 is operatively connected to the gate of the output transistor OP1 of the isolated floating well circuit 25 of the output driving means 20, and another of the pair of transistors N3, N4 is operatively connected to the gate of the well control transistor OP2 of the isolated floating well circuit 25.

The transistors N3, N4 function to isolate signals PIN and CTL from INP and ENB respectively. The transistor N3 is always on due to its gate being tied to $V_{DD}$. When INP is a 0, the transistor N3 pulls node PIN to a 0. When INP is high, the transistor N3 passes $V_{DD}$ (a $V_{GE}$ to the PIN node in practice gives a 3.3 volt $V_{DD}$, and N2 passes about 2.4 volts). The transistor N3 also isolates node INP from PIN when PIN goes above $V_{DD}$. When the I/O buffer 10 is tri-stated and a signal above $V_{DD}$ is applied to the output terminal, the well follows the signal up and PIN follows the well. When INP is at $V_{DD}$, the base is at $V_{DD}$. Because the transistor N3 is effective, PIN can go to 5.5 volts without problems. The transistor N4 operates in a similar way as the transistor N3 and, for brevity and conciseness, will not be described in detail further herein.

The I/O buffer 10 advantageously is designed for a 3.3 volt technology working with nominal 5 volt inputs when tri-stated. The applied signals truth table during circuit operation is preferably as follows:

| Circuit Operation Applied Signals Truth Table | | | | |
|---|---|---|---|---|
| IN | + | – | + | – |
| EN | – | – | + | + |
| Output | – | + | T/S | T/S |

As illustrated in FIGS. 1–5, and as described above, the present invention also advantageously provides a method of inhibiting current flow in an I/O buffer 10. A method of inhibiting current flow during a high impedance condition in a tri-state I/O buffer 10 arranged to be powered by a supply voltage and to drive an output terminal is provided. The output terminal is preferably arranged to receive an external voltage which can be higher than the supply voltage during the high impedance. The method preferably includes operatively connecting the output terminal to the supply voltage with an isolated floating well circuit 25 so as to drive the output terminal and controlling a buffer input signal supplied to the isolated floating well circuit 25. A biasing control signal preferably is supplied to the isolated floating well circuit 25. The voltage swing of at least one of a plurality of transistors OP1, OP2, OP3, OP4, OP5 of the floating well circuit 25 is limited to thereby inhibit or prevent overstressing of the gate oxide of the at least one of the plurality of transistors OP1, OP2, OP3, OP4, OP5 when at least one of the plurality of transistors OP1, OP2, OP3, OP4, OP5 is forwardly biased and the floating well is positively biased by the external voltage applied to the output terminal.

The method can also include operatively isolating the controlled buffer input signal being supplied to the isolated floating well circuit 25, operatively connecting the output terminal to ground by a pull-down circuit 35 which includes at least one switching transistor N2, and isolating the at least one switching transistor N2 from an external voltage received from the output terminal so as to responsively reduce the voltage received by the at least one output switching transistor N2. The step of controlling the buffer input signal preferably includes the steps of inverting a buffer input signal and inverting a tri-state enabling signal. The plurality of transistors OP1, OP2, OP3, OP4, OP5 of the floating well circuit 25 preferably include at least one output transistor OP1. The gate of the at least one output transistor OP1 is advantageously turned off by operatively tying the gate to the FW.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed:

1. A tri-state I/O buffer arranged to be powered by a supply voltage and to drive an output terminal, the output terminal being arranged to receive an external voltage which is higher than the supply voltage during a high impedance, the I/O buffer comprising:

output driving means connected to the supply voltage and the output terminal for driving the output terminal, said output driving means comprising a first plurality of transistors having a first conductivity type and defining an isolated floating well circuit for operatively connecting the output terminal to the supply voltage and a second plurality of transistors having a second conductivity type and defining a pull-down circuit for operatively connecting the output terminal to ground;

input controlling means connected to said output driving means and the supply voltage, and arranged for receiving a buffer input signal for controlling the buffer input signal to said output driving means;

bias controlling means connected to the isolated floating well circuit and the supply voltage, and arranged to receive a tri-state enabling signal and the buffer input signal for controlling a biasing signal to the isolated floating well circuit; and input isolating means responsive to said input controlling means, connected to the isolated floating well circuit and the supply voltage, and arranged to receive the tri-state enabling signal for operatively isolating an input control signal to the isolated floating well circuit.

2. An I/O buffer as defined in claim 1, wherein the first plurality of transistors are each formed in a common N-well, and wherein the isolated floating well circuit is operatively biased through one of the plurality of PMOS transistors.

3. An I/O buffer as defined in claim 2, wherein a first of the plurality of transistors comprises an output transistor connected to the supply voltage for operatively connecting the output terminal to the supply voltage and a second of the plurality of transistors comprises a well control transistor connected to a floating well and connected to the supply voltage for controlling the common N well of the first plurality of transistors.

4. An I/O buffer as defined in claim 3, wherein a third of the plurality of transistors is operatively connected to the gate of the output transistor for controlling the voltage applied to the gate of the output transistor, and a fourth of the plurality of transistors is operatively connected to the gate of the well control transistor, connected to the floating well, and connected to the bias controlling means for controlling the voltage applied to the gate of the well control transistor.

5. An I/O buffer as defined in claim 1, wherein the second plurality of transistors of the pull-down circuit includes at least one pull-down output switching transistor and at least one stacked transistor connected to the at least one pull-down output switching transistor, the at least one stacked transistor forming an output terminal isolation device arranged to receive an external voltage from the output terminal and responsively reducing the voltage received by the at least one output switching transistor.

6. An I/O buffer as defined in claim 5, wherein said input isolating means comprises at least a pair of transistors, one of said at least a pair of transistors being operatively connected to the gate of the output transistor of the isolated floating well circuit of said output driving means and another of said at least a pair of transistors being operatively connected to the gate of the well control transistor of the isolated floating well circuit of said output driving means.

7. An I/O buffer as defined in claim 1, wherein said bias controlling means includes voltage swing limiting means connected to the isolated floating well circuit of said output driving means for limiting the voltage swing of at least one of the first plurality of transistors to thereby inhibit overstressing of the gate oxide of the at least one of the first plurality of transistors.

8. An I/O buffer as defined in claim 7, wherein said bias controlling means further includes a first plurality of transistors defining an inverting circuit and a second plurality of transistors defining a NOR gate circuit, and wherein said voltage swing limiting means is connected to a source of at least one of the plurality of transistors of each of the inverting circuit and the NOR gate circuit.

9. An I/O buffer as defined in claim 4, wherein said bias controlling means includes voltage swing limiting means connected to the isolated floating well circuit of said output driving means for limiting the voltage swing of the third and fourth of the plurality of transistors of the isolated floating well circuit to thereby inhibit overstressing of the gate oxide of the third and fourth of the plurality of transistors when the third and fourth of the plurality of transistors are forwardly biased and the floating well is positively biased by an external voltage applied to the output terminal.

10. An I/O buffer as defined in claim 7, wherein said voltage swing limiting means comprises a biasing circuit arranged to be connected to ground, and wherein said bias controlling means further includes a first plurality of transistors being arranged so as to define an inverting circuit connected to the supply voltage and arranged to receive the tri-state enabling signal and a biasing signal from the biasing circuit.

11. An I/O buffer as defined in claim 10, wherein the inverting circuit comprises an NMOS transistor and a stacked PMOS transistor each having the gate thereof arranged to receive the tri-state enabling signal, the drain of the stacked PMOS transistor connected to the supply voltage, the source of the stacked PMOS transistor and the source of the NMOS transistor being connected to the isolated floating well circuit of said output driving means so as to provide a tri-state enabling output signal thereto responsive to the tri-state input enabling signal, and the source of the NMOS transistor being connected to the biasing circuit.

12. An I/O buffer as defined in claim 11, wherein the biasing controlling means further includes a second plurality of transistors connected to the biasing circuit and the isolated floating well circuit of said output driving means, arranged to receive the input signal and the tri-state enabling signal, and defining a NOR gate.

13. An I/O buffer as defined in claim 1, wherein said input controlling means includes signal inverting means arranged to receive the buffer input signal and the tri-state enabling signal for inverting each of the buffer input and tri-state enabling signals.

14. An I/O buffer as defined in claim 13, wherein said input controlling means further includes a floating well input controlling circuit and a pull-down input controlling circuit each respectively connected to said signal inverting means, each of the isolated floating well and pull-down input controlling circuits being arranged to receive the tri-state enabling signal, the inverted tri-state enabling signal, and the inverted buffer input signal and responsively providing a floating well input control signal and a pull-down input control signal respectively to the isolated floating well circuit and the pull-down circuit.

15. A tri-state I/O buffer arranged to be powered by a supply voltage and to drive an output terminal, the output terminal being arranged to receive an external voltage which is higher than the supply voltage during a high impedance, the I/O buffer comprising:

output driving means connected to the supply voltage and the output terminal for driving the output terminal, said output driving means comprising a first plurality of transistors having a first conductivity type and defining an isolated floating well circuit for operatively connecting the output terminal to the supply voltage and a second plurality of transistors having a second conductivity type and defining a pull-down circuit of the output driving means for operatively connecting the output terminal to ground;

input controlling means connected to the isolated floating well circuit, the pull-down circuit, and the supply voltage, and arranged for receiving a buffer input signal for controlling the buffer input signal respectively to each of the isolated floating well and pull-down circuits;

bias controlling means connected to the isolated floating well circuit of said output driving means, connected to the supply voltage, and arranged to receive a tri-state enabling signal and the buffer input signal for controlling a biasing signal to the isolated floating well circuit; and input isolating means responsive to said input controlling means, connected to the isolated floating well circuit of said output driving means, connected to the supply voltage, and arranged to receive the tri-state enabling signal for operatively isolating an input control signal to the isolated floating well circuit.

16. An I/O buffer as defined in claim 15, wherein said input isolating means comprises at least a pair of transistors, one of said at least a pair of transistors being operatively connected to the gate of the output transistor of the isolated floating well circuit of said output driving means and another of said at least a pair of transistors being operatively connected to the gate of the well control transistor of the isolated floating well circuit of said output driving means.

17. An I/O buffer as defined in claim 16, wherein the first plurality of transistors are each formed in a common N-well, and wherein the isolated floating well circuit is operatively biased through one of the first plurality of transistors.

18. An I/O buffer as defined in claim 17, wherein a first of the plurality of transistors comprises an output transistor connected to the supply voltage and a second of the plurality of transistors comprises a well control transistor connected to a floating well and connected to the supply voltage for controlling the common N well of the plurality of transistors.

19. An I/O buffer as defined in claim 18, wherein a third of the plurality of transistors is operatively connected to the gate of the output transistor for controlling the voltage applied to the gate of the output transistor, and a fourth of the plurality of transistors is operatively connected to the gate of the well control transistor, connected to the floating well, and connected to the bias controlling means for controlling the voltage applied to the gate of the well control transistor.

20. An I/O buffer as defined in claim 19, wherein the plurality of transistors of the pull-down circuit includes at least one pull-down output switching transistor and at least one stacked transistor connected to the at least one pull-down output switching transistor, the at least one stacked transistor forming an output terminal isolation device arranged to receive an external voltage from the output terminal and responsively reducing the voltage received by the at least one output switching transistor.

21. An I/O buffer as defined in claim 20, wherein said bias controlling means includes voltage swing limiting means connected to the isolated floating well circuit of said output driving means for limiting the voltage swing of at least one of the first plurality of transistors of the floating well circuit to thereby inhibit overstressing of the gate oxide of the at least one of the first plurality of transistors.

22. An I/O buffer as defined in claim 21, wherein said bias controlling means further includes a first plurality of transistors defining an inverting circuit and a second plurality of transistors defining a NOR gate circuit, and wherein said voltage swing limiting means is connected to a source of at least one of the plurality of transistors of each of the inverting circuit and the NOR gate circuit.

23. An I/O buffer as defined in claim 21, wherein said bias controlling means includes voltage swing limiting means connected to the isolated floating well circuit of said output driving means for limiting the voltage swing of the third and fourth of the first plurality of transistors of the isolated floating well circuit to thereby inhibit overstressing of the gate oxide of the third and fourth of the first plurality of transistors when the third and fourth of the first plurality of transistors are forwardly biased and the floating well is positively biased by an external voltage applied to the output terminal.

24. An I/O buffer as defined in claim 23, wherein said voltage swing limiting means comprises a biasing circuit arranged to be connected to ground, and wherein said bias controlling means further includes a first plurality of transistors being arranged so as to define an inverting circuit connected to the supply voltage and arranged to receive the tri-state enabling signal and a biasing signal from the biasing circuit.

25. An I/O buffer as defined in claim 24, wherein the inverting circuit comprises an NMOS transistor and a stacked PMOS transistor each having the gate thereof arranged to receive the tri-state enabling signal, the drain of the stacked PMOS transistor connected to the supply voltage, the source of the stacked PMOS transistor and the source of the NMOS transistor being connected to the floating well circuit of said output driving means so as to provide a tri-state enabling output signal thereto responsive to the tri-state input enabling signal, and the source of the NMOS transistor being arranged to receive the biasing signal.

26. An I/O buffer as defined in claim 25, wherein the biasing control means further includes a second plurality of transistors connected to the biasing circuit and the floating well circuit of said output driving means, arranged to receive the input signal and the tri-state enabling signal, and defining a NOR gate.

27. An I/O buffer as defined in claim 26, wherein said input controlling means includes signal inverting means arranged to receive the buffer input signal and the tri-state enabling signal for inverting each of the buffer input and tri-state enabling signals.

28. An I/O buffer as defined in claim 27, wherein said input controlling means further includes a floating well input controlling circuit and a pull-down input controlling circuit each respectively connected to said signal inverting means, each of the isolated floating well and pull-down input controlling circuits being arranged to receive the tri-state enabling signal, the inverted tri-state enabling signal, and the inverted buffer input signal and responsively providing a floating well input control signal and a pull-down input control signal respectively to the isolated floating well circuit and the pull-down circuit.

29. A tri-state I/O buffer arranged to be powered by a supply voltage and to drive an output terminal, the I/O buffer comprising:

output driving means connected to the supply voltage and the output terminal for driving the output terminal, said output driving means including a plurality of transistors defining an isolated floating well circuit for operatively connecting the output terminal to the supply voltage;

input controlling means connected to said output driving means and the supply voltage, and arranged for receiving a buffer input signal for controlling the buffer input signal to said output driving means;

input isolating means connected to said isolated floating well circuit and responsive to said input controlling means for operatively isolating an input control signal to the isolated floating well circuit; and bias controlling means connected to the isolated floating well circuit of said output driving means for controlling a biasing signal to the isolated floating well circuit, said bias controlling means including voltage swing limiting means connected to the isolated floating well circuit for limiting the voltage swing of at least one of the plurality of transistors of the floating well circuit to thereby inhibit overstressing of the gate oxide of the one of the plurality of transistors.

30. An I/O buffer as defined in claim 29, wherein said input controlling means includes signal inverting means arranged to receive the buffer input signal and the tri-state enabling signal for inverting each of the buffer input and tri-state enabling signals.

31. An I/O buffer as defined in claim 30, wherein said input controlling means further includes a floating well input controlling circuit and a pull-down input controlling circuit each respectively connected to said signal inverting means, each of the isolated floating well and pull-down input controlling circuits being arranged to receive the tri-state enabling signal, the inverted tri-state enabling signal, and the inverted buffer input signal and responsively providing a floating well input control signal and a pull-down input control signal respectively to the isolated floating well circuit and the pull-down circuit.

32. An I/O buffer as defined in claim 29, wherein said input isolating means comprises at least a pair of transistors, one of said at least a pair of transistors being operatively connected to the gate of the output transistor of the isolated floating well circuit of said output driving means and another of said at least a pair of transistors being operatively connected to the gate of the well control transistor of the isolated floating well circuit of said output driving means.

33. An I/O buffer as defined in claim 32, wherein the plurality of transistors of the floating well circuit are each formed in a common N-well, and wherein the isolated floating well circuit is operatively biased through one of the plurality of transistors.

34. An I/O buffer as defined in claim 33, wherein a first of the plurality of transistors comprises an output transistor connected to the supply voltage and a second of the plurality of transistors comprises a well control transistor connected to a floating well and connected to the supply voltage for controlling the common N well of the plurality of transistors.

35. An I/O buffer as defined in claim 34, wherein a third of the plurality of transistors is operatively connected to the gate of the output transistor for controlling the voltage applied to the gate of the output transistor, and a fourth of the plurality of transistors is operatively connected to the gate of the well control transistor, connected to the floating well, and connected to the bias controlling means for controlling the voltage applied to the gate of the well control transistor.

36. An I/O buffer as defined in claim 35, wherein said floating well circuit of said output driving means is defined by a first plurality of transistors, and wherein said output driving means further comprises a second plurality of transistors defining a pull-down circuit which includes at least one pull-down output switching transistor and at least one stacked transistor connected to the at least one pull-down output switching transistor, the at least one stacked transistor forming an output terminal isolation device arranged to receive an external voltage from the output terminal and responsively reducing the voltage received by the at least one output switching transistor.

37. An I/O buffer as defined in claim 36, wherein said bias controlling means further includes a first plurality of transistors defining an inverting circuit and a second plurality of transistors defining a NOR gate circuit, and wherein said voltage swing limiting means is connected to a source of at least one of the plurality of transistors of each of the inverting circuit and the NOR gate circuit.

38. An I/O buffer as defined in claim 35, wherein said bias controlling means includes voltage swing limiting means connected to the isolated floating well circuit of said output driving means for limiting the voltage swing of the third and fourth of the first plurality of transistors of the isolated floating well circuit to thereby inhibit overstressing of the gate oxide of the third and fourth of the first plurality of transistors when the third and fourth of the first plurality of transistors are forwardly biased and the floating well is positively biased by an external voltage applied to the output terminal.

39. An I/O buffer as defined in claim 37, wherein said voltage swing limiting means comprises a biasing circuit arranged to be connected to ground, and wherein said bias controlling means further includes a first plurality of transistors defining an inverting circuit connected to the supply voltage, arranged to receive a tri-state enabling signal, and arranged to receive a biasing signal from the biasing circuit.

40. An I/O buffer as defined in claim 39, wherein the inverting circuit comprises an NMOS transistor and a stacked PMOS transistor each having the gate thereof arranged to receive the tri-state enabling signal, the drain of the stacked PMOS transistor connected to the supply voltage, the source of the stacked PMOS transistor and the source of the NMOS transistor being connected to the floating well circuit of said output driving means so as to provide a tri-state enabling output signal thereto responsive to the tri-state input enabling signal, and the source of the NMOS transistor being arranged to receive the biasing signal.

41. An I/O buffer as defined in claim 40, wherein said bias controlling means further includes a second plurality of transistors connected to the biasing circuit and the floating well circuit of said output driving means, arranged to receive the input signal and the tri-state enabling signal, and defining a NOR gate.

42. A method of inhibiting current during a high impedance in a tri-state I/O buffer arranged to be powered by a supply voltage and to drive an output terminal, the output terminal being arranged to receive an external voltage which can be higher than the supply voltage during the high impedance, the method comprising:

operatively connecting the output terminal to the supply voltage with an isolated floating well circuit so as to drive the output terminal;

controlling a buffer input signal supplied to the isolated floating well circuit;

controlling a biasing signal to the isolated floating well circuit;

operatively isolating the controlled buffer input signal being supplied to the isolated floating well circuit: and limiting the voltage swing of at least one of a plurality of transistors of the floating well circuit to thereby inhibit overstressing of the gate oxide of the at least one of the plurality of transistors when at least one of the plurality of transistors is forwardly biased and the floating well is positively biased by the external voltage applied to the output terminal.

43. A method as defined in claim 42, further comprising operatively connecting the output terminal to ground by a pull-down circuit which includes at least one switching transistor and isolating the at least one switching transistor from an external voltage received from the output terminal so as to responsively reduce the voltage received by the at least one output switching transistor.

44. A method as defined in claim 42, wherein the step of controlling the buffer input signal includes the steps of inverting a buffer input signal and inverting a tri-state enabling signal.

45. A method as defined in claim 42, wherein the plurality of transistors of the floating well circuit include at least one output transistor, and wherein a gate of the at least one output transistor is turned off by operatively tying the gate to a floating well.

* * * * *